(12) United States Patent
Fornara et al.

(10) Patent No.: US 8,426,234 B2
(45) Date of Patent: Apr. 23, 2013

(54) DEVICE FOR DETECTING AN ATTACK AGAINST AN INTEGRATED CIRCUIT

(75) Inventors: Pascal Fornara, Pourrieres (FR); Christian Rivero, Luynes (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 29 days.

(21) Appl. No.: 13/239,118

(22) Filed: Sep. 21, 2011

(65) Prior Publication Data

US 2012/0009774 A1  Jan. 12, 2012

Related U.S. Application Data

(62) Division of application No. 12/538,030, filed on Aug. 7, 2009.

(30) Foreign Application Priority Data

Aug. 13, 2008  (FR) ...................................... 08 55552

(51) Int. Cl.
*H01L 23/02*  (2006.01)
(52) U.S. Cl.
USPC ....... 438/52; 257/922; 257/679; 257/E23.194
(58) Field of Classification Search ........................ None
See application file for complete search history.

(56) References Cited

U.S. PATENT DOCUMENTS

| | | | |
|---|---|---|---|
| 5,761,054 A | 6/1998 | Kuhn | |
| 6,576,991 B1 | 6/2003 | Bonvalot et al. | |
| 6,946,960 B2 | 9/2005 | Sisson et al. | |
| 7,485,976 B2 | 2/2009 | Knudsen | |
| 7,868,441 B2 | 1/2011 | Eaton et al. | |
| 8,288,857 B2 * | 10/2012 | Das et al. | 257/687 |
| 8,330,191 B2 * | 12/2012 | Hoofman et al. | 257/254 |
| 2009/0243092 A1 | 10/2009 | Nishimura et al. | |
| 2011/0089506 A1 | 4/2011 | Hoofman et al. | |

FOREIGN PATENT DOCUMENTS

FR  2801999 A1  6/2001

OTHER PUBLICATIONS

French Search Report dated Mar. 18, 2009 from corresponding French Patent Application No. 08/55552.

* cited by examiner

*Primary Examiner* — Benjamin Sandvik
(74) *Attorney, Agent, or Firm* — Wolf, Greenfield & Sacks, P.C.

(57) ABSTRACT

An integrated circuit including an intrusion attack detection device. The device includes a single-piece formed of a conductive material and surrounded with an insulating material and includes at least one stretched or compressed elongated conductive track, connected to a mobile element, at least one conductive portion distant from said piece and a circuit for detecting an electric connection between the piece and the conductive portion. A variation in the length of said track in an attack by removal of the insulating material, causes a displacement of the mobile element until it contacts the conductive portion.

20 Claims, 3 Drawing Sheets

Fig 5

DEVICE FOR DETECTING AN ATTACK AGAINST AN INTEGRATED CIRCUIT

CROSS REFERENCE TO RELATED APPLICATIONS

This application is a division of prior U.S. patent application Ser. No. 12/538,030, filed Aug. 7, 2009, entitled DEVICE FOR DETECTING AN ATTACK AN INTEGRATED CIRCUIT which application claims the priority benefit of French patent application number 08/55552, filed on Aug. 13, 2008, entitled DEVICE FOR DETECTING AN ATTACK AN INTEGRATED CIRCUIT, which applications are hereby incorporated by reference to the maximum extent allowable by law.

BACKGROUND OF THE INVENTION

1. Field of the Invention

The present disclosure relates to a device for detecting attacks by contact on an integrated circuit. This type of attacks is generally called an "intrusion attack" and comprises applying conductive probes directly on areas of the integrated circuit to sample signals therefrom. In an integrated circuit, the active areas contain circuits for processing data which may be confidential, such as for example in bank card chips or access-control chips in toll television applications.

2. Discussion of the Related Art

To protect the circuits located in the active area from any fraudulent intrusion, it is known to use a shield covering the entire circuit surface or part of it. This shield is generally formed of one or of several conductive paths formed in one or several metallization levels above the active area to be protected.

The aim of such conductive paths is to detect a discontinuity or any electric modification of their properties, for example, their resistance or capacitance. The conductive paths run along the entire surface or only an area of the circuit to be protected, in an irregular and random manner. If a "hacker" attempts to cross the metallization level containing the path, by introduction of one or several probes, a detection circuit is supposed to detect a rupture in the conductive path.

A disadvantage of such a solution is that it does not enable to detect the removal of the insulating layers covering the conductive path. Once the conductive path has been exposed, a "hacker" might double this conductive path with an external section to simulate an electric continuity. The conductive path could then be interrupted without this being detected.

SUMMARY OF THE INVENTION

At least one embodiment of the present invention aims at improving the detection of attacks by intrusion on an integrated circuit by enabling to detect the removal of insulating layers covering the integrated circuit.

Thus, an embodiment of the present invention provides an integrated circuit comprising an intrusion attack detection device. The device comprises a single-piece formed of a conductive material and surrounded with an insulating material and comprising at least one stretched or compressed elongated conductive track, connected to a mobile element, at least one conductive portion distant from said piece and a circuit for detecting an electric connection between the piece and the conductive portion. This results in a variation in the length of said track in an attack by removal of the insulating material, causing a displacement of the mobile element until it contacts the conductive portion.

According to an embodiment of the present invention, the single-piece comprises a first bar extending along a first direction, a second bar extending along a second direction inclined with respect to the first direction and connected to a first lateral surface of the first bar at the level of a first junction area, and a third bar extending along a third direction inclined with respect to the first direction and connected to a second lateral surface of the first bar, opposite to the first lateral surface, at the level of a second junction area, the first and second junction areas being shifted along the first direction. The at least one conductive portion is distant from the first, second, and third bars and arranged opposite to the first or second lateral surface. This results in a variation in the length of the second and third bars in the attack by removal of the insulating material, causing a pivoting of the first bar until it contacts the conductive portion.

According to an embodiment of the present invention, the first bar comprises first and second ends. The conductive portion is arranged opposite to the first lateral surface, at the level of the first end, the circuit comprising an additional conductive portion arranged opposite to the second lateral surface, distantly from the first, second, and third bars, at the level of the second end. This results in a variation of the length of the second and third bars in the attack by removal of the insulating material, causing a pivoting of the first bar so that the first end comes into contact with the conductive portion and that the second end comes into contact with the additional conductive portion.

According to an embodiment of the present invention, the second bar continues in a first track of the conductive material of larger cross-section and the third bar continues in a second track of the conductive material of larger cross-section.

According to an embodiment of the present invention, the second and third bars belong to a conductive path.

According to an embodiment of the present invention, the cross-section of the second bar decreases at the level of the first junction area and the cross-section of the third bar decreases at the level of the second junction area.

According to an embodiment of the present invention, the first bar comprises a tapered surface for bearing against the conductive portion during the pivoting of the first bar.

According to an embodiment of the present invention, the second and third directions are parallel to each other and perpendicular to the first direction.

An embodiment of the present invention also provides a method for manufacturing an integrated circuit comprising a device for detecting an attack by contact, comprising the steps of forming a single-piece formed of a conductive material and surrounded with an insulating material and comprising at least one elongated conductive track connected to a mobile element, at least one conductive portion distant from said piece and a circuit for detecting the creation of an electric connection between the piece and the conductive portion and of annealing. This results in the creation of tensile or compressive stress in said conductive track and in a variation of the length of said track in an attack by removal of the insulating material, causing a displacement of the mobile element until it contacts the conductive portion.

The foregoing objects, features, and advantages of the present invention will be discussed in detail in the following non-limiting description of specific embodiments in connection with the accompanying drawings.

DETAILED DESCRIPTION

Figure 1:
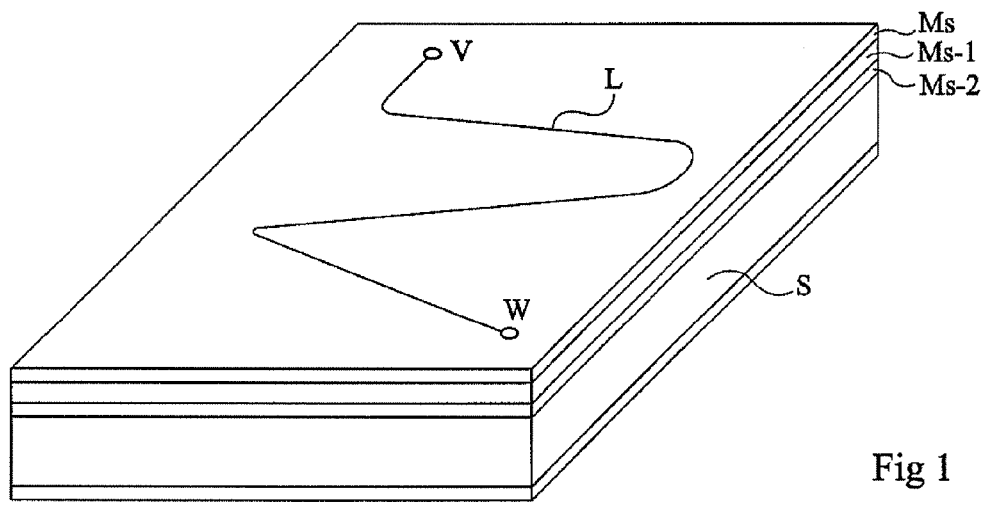
FIG. 1 is intended to show the state of the art.

For clarity, the same elements have been designated with the same reference characters in the different drawings and, further, as usual in the representation of integrated circuits, the various drawings are not to scale. In the following description, an integrated circuit comprising a substrate (for example, a solid semiconductor substrate, a silicon-on-insulator substrate (SOI), etc.) covered with a stack of layers of an insulating material at the level of which metal tracks of different metallization levels are provided is considered. The metal tracks of a given metallization level may be arranged on the surface of an insulating layer or formed in an insulating layer, leveling the surface thereof. The metal tracks most remote from the substrate are called metal tracks of the last metallization level, or upper metallization level. The metal tracks of the last metallization level are covered with an insulating layer, generally called a passivation layer.

According to an embodiment of the present invention, a device for detecting the removal of an insulating layer covering metal tracks of a given metallization level is formed, at least partly, by metal tracks of the given metallization level. Advantageously, according to an embodiment, the metal tracks forming the detection device may also belong to a conductive path of a protection shield. An embodiment of the present invention is based on the fact that a conventional method for manufacturing an integrated circuit causes the appearance of tensile stress in the metal tracks of the different metallization levels. This is due to the fact that an anneal is generally performed once the metal tracks and the insulating layers have been formed. The anneal causes a growth of the grains of the metal tracks and a decrease in the grain boundary density. This creates tensile stress in the metal tracks, given that the insulating material which surrounds them forces them to keep their shape. The removal of the insulating material surrounding the metal tracks relieves the stress in these tracks. An embodiment of the present invention provides a device for detecting the removal of the insulating material in an intrusion attack. The device comprises a mechanical switch comprising a mobile element which is displaced on relief of the stress to establish an electric contact. The creation of the electric contact is detected and is representative of the removal of the insulating material.

FIG. 1 is a perspective view of an integrated circuit conventionally provided with a protection shield. The circuit comprises a substrate S covered with a stack of insulating layers to which are associated different metallization levels M1 ... Ms. A conductive path L delimited by terminals V and W is formed in one of these levels, for example, upper metallization level Ms. Conductive path L is connected at its ends to a circuit, not shown, capable of detecting an interruption of conductive path L.

Figure 2:
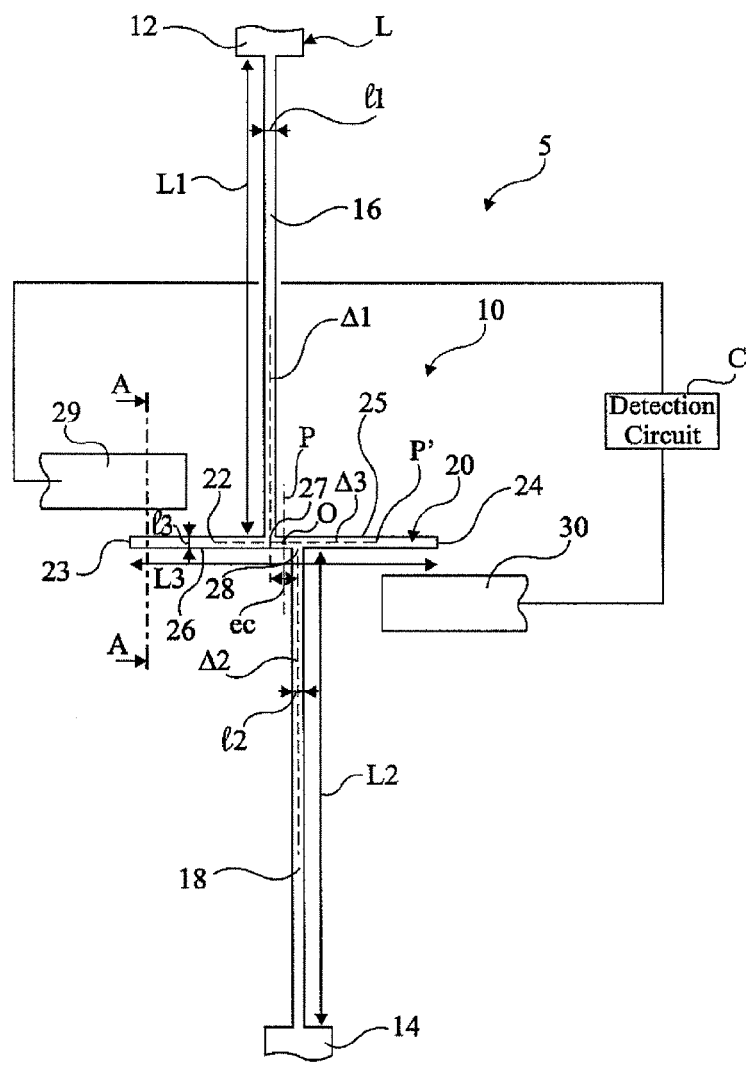
FIG. 2 is a simplified top view of a device for detecting attacks by contact with an integrated circuit according to an embodiment of the present invention.

FIG. 2 shows a detection device 5 according to an embodiment of the present invention. Device 5 comprises a mechanical switch 10 connected to a detection circuit C. More specifically, FIG. 2 is a partial simplified top view of metal tracks of a same metallization level of an integrated circuit forming switch 10 according to an embodiment of the present invention, detection circuit C being schematically represented by a block. Switch 10 may be duplicated at several locations at the level of a same metallization level. It may further be duplicated in several metallization levels of the same integrated circuit.

Switch 10 is formed at the level of a conductive path L comprising first and second metal tracks 12, 14. It comprises an arm 16 corresponding to a metal track of length L1, of width l1, and extending along a rectilinear central axis Δ1. Arm 16 continues track 12 and has a cross-section smaller than the cross-section of track 12. Switch 10 further comprises an arm 18 corresponding to a metal track of length L2, of width l2, and extending along a rectilinear central axis Δ2. Arm 18 continues track 14 and has a cross-section smaller than the cross-section of track 14. Axes Δ1 and Δ2 are, for example, parallel. In the present embodiment, arms 16, 18 substantially have a constant cross-section.

Switch 10 further comprises a bar 20 corresponding to a metal track having a length L3, a width l3, and extending along a rectilinear central axis Δ3 perpendicular to axes Δ1 and Δ2. Bar 20 comprises a central portion 22 and two free ends 23, 24. Central portion 22 comprises two opposite lateral surfaces 25, 26. Switch 10 is symmetrical with respect to a plane of symmetry P which corresponds to the plane perpendicular to axis Δ3 equidistant from ends 23 and 24. Call O the intersection point between plane P and axis Δ3. Call P' the plane perpendicular to axes Δ1 and Δ2 and containing axis Δ3. At the end opposite to track 12, arm 16 is connected to surface 25 of central portion 22 at the level of a junction area 27 and, at the end opposite to conductive track 14, arm 18 is connected to surface 26 of central portion 22 at the level of a junction area 28. Arms 16, 18 are thus arranged on either side of bar 20. Further, arms 16, 18 are located on either side of plane P. Call spacing ec the distance, measured along direction Δ3, between the middle of junction area 27 and the middle of junction area 28, that is, in the present embodiment, between axes Δ1 and Δ2.

Switch 10 further comprises metal tracks 29, 30. Track 29 is arranged on the same side of bar 20 as arm 16 and extends opposite to a portion of surface 25 of central portion 22 close to end 23. Track 30 is arranged on the same side of bar 20 as arm 18 and extends in front of a portion of surface 26 of central portion 22 on the side of end 24. Tracks 29 and 30 are connected to circuit C, which is capable of detecting whether tracks 29, 30 are electrically connected to each other.

In the embodiment shown in FIG. 2, arms 16, 18, tracks 12, 14, and bar 20 are made of a single piece.

Figure 3:
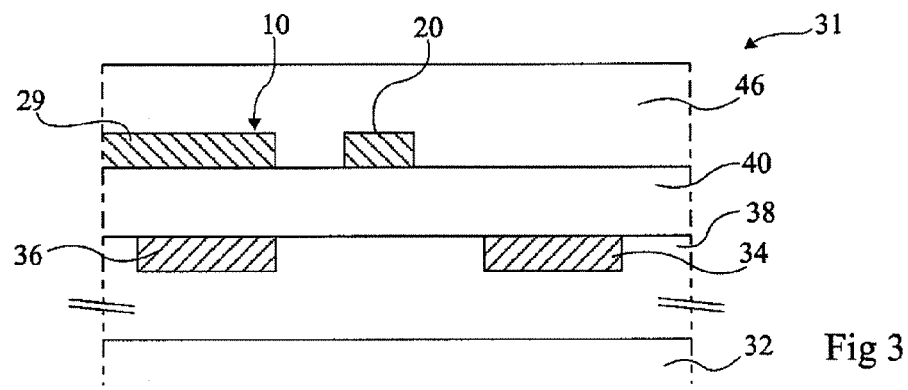
FIG. 3 is a simplified cross-section view of the detection device of FIG. 2.

FIG. 3 shows a partial simplified cross-section view of switch 10 along line A-A. Switch 10 is formed at the level of an integrated circuit 31 comprising a semiconductor substrate 32, for example, made of silicon, covered with a stack of insulating layers at the level of which are arranged metal tracks of different metallization levels. As an example, metal tracks 34, 36 of metallization level Ms−1 leveling the surface of an insulating layer 38 have been shown. An insulating layer 40 covering insulating layer 38 and metal tracks 36 and 34 has further been shown. The metal tracks of metallization level Ms 20, 29 extend on insulating layer 40. As an example, metal tracks 34, 36 are made of copper and metal tracks 20, 29 are made of aluminum. An insulating layer 46, called passivation layer, covers metal tracks 20, 29 and insulating layer 40. Layers 40, 46 are made of a same insulating material, for example, silicon oxide.

The method for manufacturing integrated circuit 31 comprises an anneal step which comprises the step of, after the forming of insulating layer 46 covering metal tracks 20, 29, heating integrated circuit 31 up to a temperature, for example, on the order of a few hundreds of degrees, for example, 400° C., for several tens of minutes, for example, 50 minutes. The anneal step causes an increase in the size of the metal grains of the metal tracks, in particular the metal grains in arms 16, 18 by decrease of the density of the grain boundaries. This increase in the grain size creates tensile stress in the metal grains of arms 16, 18. This tensile stress cannot be relieved because of the presence of insulating layers 40, 46 which surround arms 16, 18 and force them to keep their initial shapes.

Figure 4:
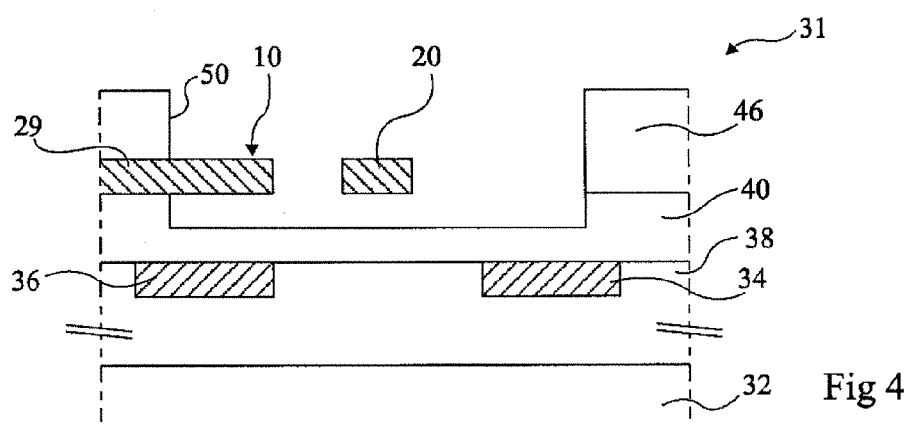
FIG. 4 is a cross-section view similar to FIG. 3 illustrating the principle of an attack by contact.

FIG. 4 is a view similar to FIG. 3 and illustrates the principle of an attack by contact. Such an attack comprises an initial step of etching an opening 50 at the surface of integrated circuit 31 where the contacts are desired to be taken. Opening 50 is formed by etching of insulating layer 46. Since insulating layers 40 and 46 are formed of the same insulating material, it is not possible to accurately control the depth of opening 50. If the attack is performed in the region of circuit 31 containing switch 10, for example, to duplicate conductive path L, opening 50 will at least partially penetrate into insulating layer 40. After the forming of opening 50, bar 20 is completely disengaged and arms 16 and 18 are at least partially disengaged.

The removal of the insulating material surrounding arms 16, 18 results in a relieving of the tensile stress in arms 16, 18, that is, a decrease of lengths L1 and L2. Since arms 16, 18 remain anchored at one end to tracks 12, 14, their shortening causes a pivoting of bar 20 around center O, with axis Δ3 substantially remaining in a plane perpendicular to plane P. Bar 20 pivots enough to come into contact with metal tracks 29, 30.

Figure 5:
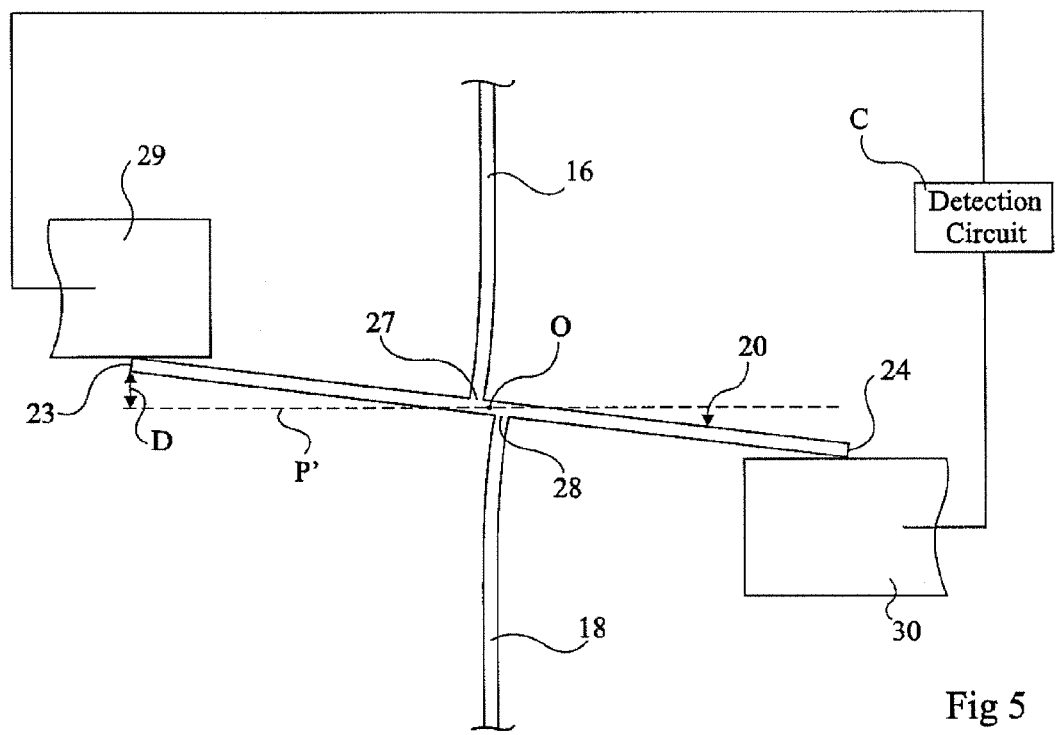
FIG. 5 is a view similar to FIG. 2 illustrating the operation of the detection device according to the present embodiment of the invention in an attack by contact.

FIG. 5 is a detail view of FIG. 2 which shows the state of switch 10 after the etching of opening 50. Since arms 16 and 18 are not in prolongation of each other, their shortening has caused a pivoting of bar 20. A slight deformation of arms 16, 18 by buckling can be observed. Call clearance D of bar 20 the distance between the edge of end 24 closest to plane P' and plane P' after the stress has been relieved.

Detection circuit C connected to tracks 29, 30 detects the coming into contact of bar 20 with metal tracks 29, 30. This may be interpreted as corresponding to a contact attack and may cause the stopping of the operation of integrated circuit 31.

Figure 6:
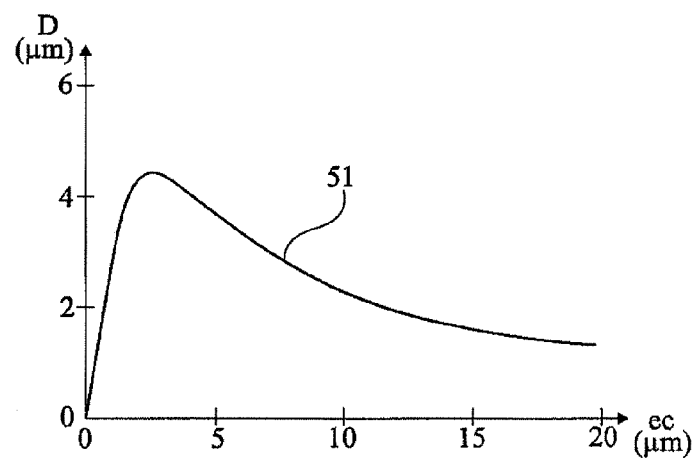
FIG. 6 shows the variation of an operating parameter of the detection device of FIG. 2 according to a characteristic dimension of the detection device.

FIG. 6 shows an example of a curve 51 of the variation, according to spacing ec, of clearance D observed in the absence of tracks 29, 30. Curve 51 is obtained for a switch 10 for which lengths L1, L2, and L3 are equal to 100 μm, for which widths l1, l2, l3 are equal to 2 μm, and for which the thickness of the metal tracks of metallization level Ms is, for example, on the order of 0.3 μm. It is desirable for clearance D of bar 20 to be as large as possible to ensure for a contact to always be present between bar 20 and metal tracks 29, 30 in case of an attack. In the previously-mentioned example, a clearance D on the order of 4.5 μm is obtained for a spacing ec on the order of 4 μm.

In the present embodiment, switch 10 is formed at the level of a conductive path L belonging to a protection shield. Arms 16, 18 and bar 20 electrically connect tracks 12, 14 together. Tracks 12 and 14 are connected to a circuit capable of detecting an interruption of conductive path L. This provides an additional protection, in addition to the protection provided by switch 10. According to an alternative embodiment, only metal track 29 is present. In this case, a circuit is capable of detecting whether an electric contact has been created between metal track 29 and one of tracks 12 or 14. According to another variation, tracks 29 and 30 may correspond to metal pads. This may be advantageous when several switches 10 are arranged adjacent to one another.

Figure 7:
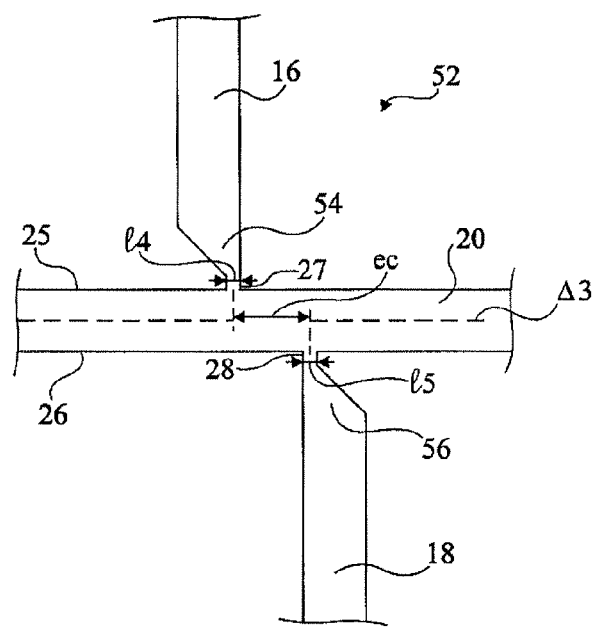
FIGS. 7 and 8 are top views of details of detection devices according to other embodiments of the present invention.

FIG. 7 shows a detail view of a switch 52 according to another embodiment of the present invention. Switch 52 has the same structure as switch 10, except that arm 16 comprises, at the level of the end connected to bar 20, a portion 54 with a decreasing cross-section, so that junction area 27 has a reduced cross-section, of width l4, with respect to arm 16. Similarly, arm 18 comprises, at the level of the end connected to bar 20, a portion 56 with a decreasing cross-section, so that junction area 28 has a reduced cross-section, of width l5, with respect to arm 18. Junction areas 27, 28 of switch 52 deform more easily during the pivoting of bar 20 than junction areas 27, 28 of switch 10 which have a greater cross-section. This enables, for the same spacing, to obtain a larger clearance D than when arms 16, 18 are of constant cross-section. As an example, for a switch 52 for which lengths L1, L2, and L3 are equal to 100 μm, for which widths l1, l2, l3 are equal to 2 μm, for which the thickness of the metal tracks of metallization level Ms is on the order of 0.3 μm, and for which widths l4 and l5 are on the order of 0.2 μm, a clearance D on the order of 10 μm is obtained, in the absence of tracks 29, 30, for a spacing ec on the order of 4 μm.

Generally, the shape of junction areas 27, 28 is determined to enable to obtain the largest possible clearance D of bar 20 in the absence of tracks 29, 30 while ensuring a sufficient mechanical resistance of switch 10. According to an example, each junction area 27, 28 may have, in a plane perpendicular to plane P, the shape of a funnel. According to another example, each junction area 27, 28 may comprise through openings.

Figure 8:
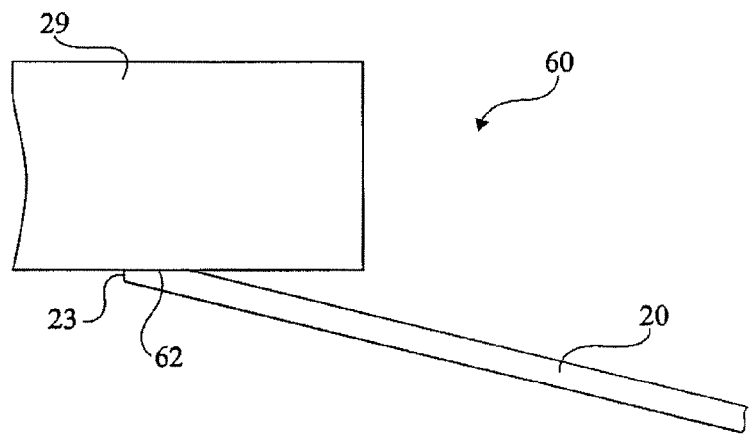

FIG. 8 shows a switch 60 according to another embodiment of the present invention. Switch 60 comprises, at each end 23 of bar 20, a tapered surface 62 which is oriented so that, in the pivoting of bar 20, tapered surface 62 ends up bearing against metal track 29. This enables to improve the contact between bar 20 and metal track 29.

In the previously-described embodiments, switch 10, 52, 60 is formed by portions of a conductive material in which tensile stress is created during the anneal step of the integrated circuit manufacturing method. As a variation, the switch may be formed of portions of a conductive material in which compressive stress appears in the anneal step. The material is, for example, a semiconductor material such as polysilicon. Thereby, when the stress is relieved, arms 16, 18 of the switch tend to lengthen. In this case, as compared with switch 10 shows in FIG. 2, arms 16 is arranged to the right of plane P and arm 18 is arranged to the left of plane P so that bar 20 pivots in the right direction when the stress is relieved to ensure the electric connection between metal tracks 29, 30.

Specific embodiments of the present invention have been described. Various alterations and modifications will occur to those skilled in the art. In particular, in the previously-described embodiments, switch 10 has a symmetrical shape. However, this is not compulsory. Further, in the previously-described embodiments, arms 16, 18 and bar 20 have, before pivoting, rectilinear shapes. However, arms 16, 18 and bar 20 may have, before pivoting, curved shapes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an integrated circuit comprising a device for detecting an attack by contact, comprising the steps of:
    forming a single-piece formed of a conductive material and surrounded with an insulating material and comprising at least one elongated conductive track connected to a mobile element, at least one conductive portion distant from said piece and a circuit for detecting the creation of an electric connection between the piece and the conductive portion; and
    annealing,
    which results in the creation of tensile or compressive stress in said conductive track and in a variation of the length of said track in an attack by removal of the insulating material, causing a displacement of the mobile element all the way until it contacts the conductive portion.

2. A method for manufacturing an integrated circuit as defined in claim 1, wherein forming a single-piece comprises:
    forming a first bar extending along a first direction;
    forming a second bar extending along a second direction inclined with respect to the first direction and connected to a first lateral surface of the first bar at a first junction area; and
    forming a third bar extending along a third direction inclined with respect to the first direction and connected to a second lateral surface of the first bar, opposite to the first lateral surface, at a second junction area, the first and second junction areas being shifted along the first direction, wherein the at least one conductive portion is spaced from the first, second and third bars and arranged opposite to the first or second lateral surface, which results in a variation in the length of the second and third bars upon removal of the insulating material, causing movement of the first bar into contact with the at least one conductive portion.

3. A method for manufacturing an integrated circuit as defined in claim 2, wherein the first bar comprises first and second ends and wherein the at least one conductive portion is arranged opposite to the first lateral surface, at the first end, further comprising forming an additional conductive portion arranged opposite to the second lateral surface and spaced from the first, second and third bars, at the second end, wherein removal of the insulating material causes the first end to contact the at least one conductive portion and the second end to contact the additional conductive portion.

4. A method for manufacturing an integrated circuit as defined in claim 2, wherein the second bar and the third bar each include a first portion of a first width and a second portion of a second width larger than the first width.

5. A method for manufacturing an integrated circuit as defined in claim 2, comprising forming the second and third bars as a conductive path of the integrated circuit.

6. A method for manufacturing an integrated circuit as defined in claim 2, comprising forming the second bar with a decreased cross-section at the first junction area and forming the third bar with a decreased cross-section at the second junction area.

7. A method for manufacturing an integrated circuit as defined in claim 2, comprising forming the first bar with a tapered surface for bearing against the at least one conductive portion upon pivoting of the first bar.

8. A method for manufacturing an integrated circuit as defined in claim 2, wherein the second and third directions are parallel to each other and perpendicular to the first direction.

9. A method for manufacturing an integrated circuit, comprising:
    forming a first conductive element on a substrate;
    forming an insulating material surrounding at least part of the first conductive element;
    forming a second conductive element on the substrate;
    spacing the second conductive element from the first conductive element such that removal of the insulating material causes the first conductive element to contact the second conductive element; and
    annealing the integrated circuit such that at least the first conductive element is stretched or compressed.

10. A method for manufacturing an integrated circuit as defined in claim 9, wherein forming the first conductive element comprises:
    forming a first conductive track extending along a first direction;
    forming a second conductive track extending along a second direction different from the first direction and connected to a first lateral surface of the first conductive track at a first junction area; and
    forming a third conductive track extending along a third direction different from the first direction and connected to a second lateral surface of the first conductive track, opposite to the first lateral surface, at a second junction area, the first and second junction areas being spaced along the first direction, wherein removal of the insulating material causes movement of the first conductive track into contact with the second conductive element.

11. A method for manufacturing an integrated circuit as defined in claim 10, wherein the first conductive track includes a first end spaced from the second conductive element, further comprising forming a third conductive element spaced from a second end of the first conductive track, wherein removal of the insulating material causes pivoting of the first conductive track so that the first end contacts the second conductive element and the second end contacts the third conductive element.

12. A method for manufacturing an integrated circuit as defined in claim 10, wherein the second conductive track and the third conductive track each include a first portion of a first width and a second portion of a second width larger than the first width.

13. A method for manufacturing an integrated circuit as defined in claim 10, comprising forming the second and third conductive tracks as a conductive path of the integrated circuit.

14. A method for manufacturing an integrated circuit as defined in claim 10, comprising forming the second conductive track with a width that decreases in a region of the first junction area and forming the third conductive track with a width that decreases in a region of the second junction area.

15. A method for manufacturing an integrated circuit as defined in claim 10, comprising forming the first conductive track with a tapered surface configured to contact the second conductive element.

16. A method for manufacturing an integrated circuit as defined in claim 10, wherein the second and third directions are parallel to each other and are perpendicular to the first direction.

17. A method for manufacturing an integrated circuit as defined in claim 10, further comprising forming a detection circuit coupled between the second and third conductive elements and configured to detect an electrical connection therebetween.

18. A method for manufacturing an integrated circuit as defined in claim 9, wherein annealing the integrated circuit comprises heating the integrated circuit to cause a tensile stress in the second and third conductive tracks.

19. A method for manufacturing an integrated circuit as defined in claim 9, wherein annealing the integrated circuit comprises heating the integrated circuit to a temperature on the order of a few hundred degrees for several tens of minutes.

20. A method for manufacturing an integrated circuit as defined in claim 9, wherein annealing the integrated circuit comprises heating the integrated circuit to 400° C. for 50 minutes.

* * * * *